United States Patent
Kleffner et al.

[11] Patent Number: 5,943,597
[45] Date of Patent: Aug. 24, 1999

[54] BUMPED SEMICONDUCTOR DEVICE HAVING A TRENCH FOR STRESS RELIEF

[75] Inventors: James H. Kleffner, Leander; Addi Burjorji Mistry, Austin, both of Tex.

[73] Assignee: Motorola, Inc., Schaumburg, Ill.

[21] Appl. No.: 09/094,974

[22] Filed: Jun. 15, 1998

[51] Int. Cl.[6] .............................. H01L 23/48; H01L 21/44
[52] U.S. Cl. ...................... 438/613; 257/737; 257/738; 257/780
[58] Field of Search ........................ 438/612, 613, 438/685, 686; 361/736, 774, 746, 760, 779; 257/737, 738, 780, 783–788

[56] References Cited

U.S. PATENT DOCUMENTS

| | | |
|---|---|---|
| 4,048,438 | 9/1977 | Zimmerman ........................ 174/68.5 |
| 5,821,608 | 10/1998 | DiStephano et al. . |
| 5,834,374 | 11/1998 | Cabral, Jr. et al. . |
| 5,834,848 | 11/1998 | Iwasaki . |
| 5,844,782 | 12/1998 | Fukasawa . |
| 5,847,456 | 12/1998 | Shoji . |

*Primary Examiner*—Chandra Chaudhari
*Assistant Examiner*—Martin Sulsky

[57] ABSTRACT

A bumped semiconductor device including bond pad (12) formed on a semiconductor die (10), and a passivation layer (14) overlying the semiconductor die and a portion of the bond pad (12). A solder bump (22) is formed so as to overlie the bond pad (12), and a stress isolation trench (15) is formed in the passivation layer (14), so as to surround the solder bump (22).

13 Claims, 2 Drawing Sheets

BUMPED SEMICONDUCTOR DEVICE HAVING A TRENCH FOR STRESS RELIEF

FIELD OF THE INVENTION

The present invention relates generally to semiconductor devices, and more particularly, to a solder bump structure that accommodates thermal and mechanical stress gradients by incorporation of a stress relief trench.

BACKGROUND OF THE INVENTION

As is well known in the art of semiconductor fabrication, following singulation of die from a semiconductor wafer, the die are generally packaged, and the packaged die are in turn mounted to a circuit board. While packaging semiconductor die is commonplace to execute bonding between the die and the circuit board, one new method, direct chip attach (DCA) eliminates the conventional package, in favor of directly bonding the chip to the circuit board. In both conventional packages and DCA, one method of bonding the semiconductor die to a substrate or to a circuit board calls for forming a plurality of solder bumps along a main surface of the die, flipping the die over, and reflowing the solder bumps while in contact with the substrate or circuit board. Such a process is known as a "flip-chip" bonding technique.

Solder bumps for flip-chip bonding may be formed by any one of various methods, the so called "C4" (controlled collapse chip connection) process, and E3 (extended evaporated eutectic) process. In each of these processes, bumps are made by evaporating a combination of lead and tin through a screen, and onto under bump metallization (UBM) that overlies bond pads. While the C4 and E3 processes are effective to form quality solder bumps on a semiconductor die, each is relatively expensive and sophisticated.

In an effort to simplify the bump forming process and decrease cost, electroless and electrolytic plating processes have been developed. In electroless and electrolytic plating, the bumps are generally formed of a lower melting point eutectic solder, 63% Sn, 37% Pb. In contrast, the C4 process generally forms solder comprising 97% Pb, 3% Sn.

Turning to the drawings, FIG. 1 illustrates a basic cross-section of a solder bump structure formed by the known electroplating process. While a single solder bump structure is shown in FIG. 1, it is understood that an array of solder bump structures is generally formed along a surface of the substrate. As shown, an aluminum pad 102 is formed on silicon die 100. Subsequently, a passivation layer 104 is blanket deposited over the silicon substrate and pads 102. Selective etching is carried out to expose the pads 102, and under bump metallization (UBM) layer 106 is blanket deposited and patterned. Generally, the passivation layer 104 is formed of glassy silicon dioxide, and the UBM layer is formed by sputtering titanium, tungsten and copper. Subsequently, copper stud 108 is electroplated so as to selectively overlie the UBM layer 106. The components of the solder bump structure are completed by electroplating lead and tin to form solder bump 110 that overlies the copper stud 108. Here, a copper stud 108 provides an interface for nucleation and growth of tin. The solder bump 110 is then reflowed, so as to assume the generally spherical shape shown in FIG. 1.

The above-described process for forming a solder bump is generally known in the art and is generally effective for providing a bump for bonding the silicon die 100 to a substrate or to a printed circuit board via DCA. However, it has been understood by the present inventors that cracks tend to form in the passivation layer 104, during actual use of a device incorporating the silicon die 100. More particularly, it has been discovered that cracks tend to form in critical area A depicted in FIG. 1. Such cracks tend to propagate unimpeded along the die passivation layer, which may lead to failure of the circuitry in silicon die 100. In this regard, it has been recognized by the present inventors that the cracks will at times form in critical area A is due to stresses, both thermal and mechanical, during actual use of the semiconductor die in an electronic device. For example, thermal expansion coefficient mismatch between the circuit board and the silicon substrate causes thermal stress cracks in passivation layer 104, in critical area A. Accordingly, a need exists in the art for an improved solder bump structure that is more robust, and resistant to cracking due to thermal stresses and mechanical stresses.

DETAILED DESCRIPTION OF THE DRAWINGS

Figure 1:
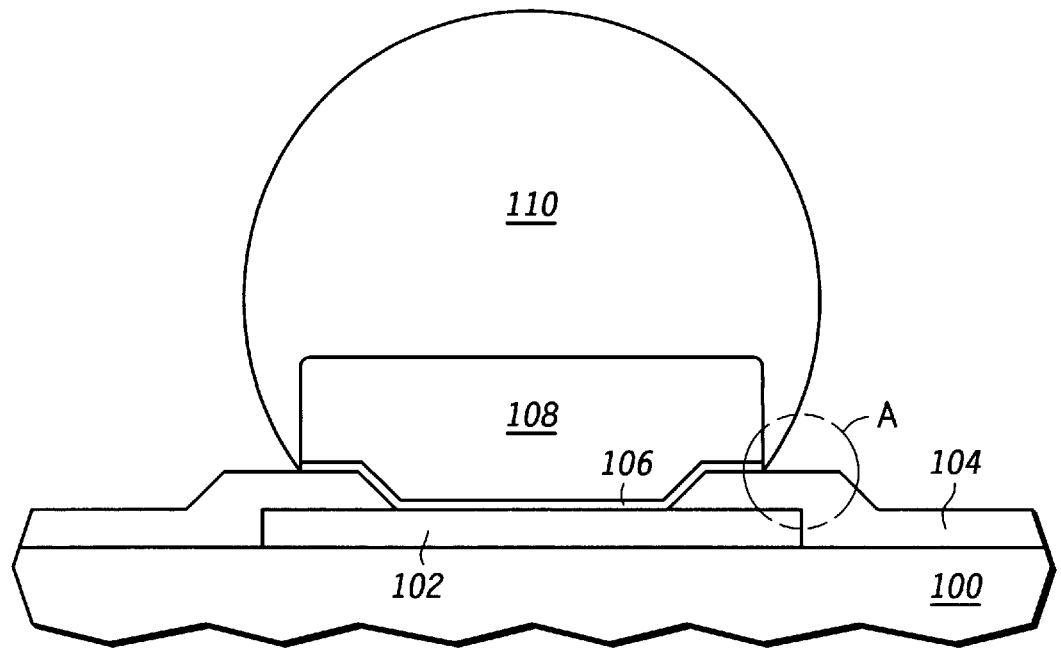
FIG. 1 is a cross-section of a conventional solder bump structure formed by electroplating.

The present invention addresses the thermal stress and mechanical stress induced cracks according to the prior art, by incorporating a stress isolation trench in the passivation layer. More particularly, turning to FIG. 2, a solder bump structure on a semiconductor die 10 is illustrated. As noted above with respect to the prior art, although a single bump structure is illustrated, such bump structures are generally formed in an array pattern across a major surface of the semiconductor die 10, or at least around the periphery of the semiconductor die. The bump structure includes an aluminum pad 12. Aluminum pad 12 is generally formed on the semiconductor die, while it is still in wafer form. Particularly, an aluminum layer is blanket deposited over the entire wafer, photoresist is then deposited on the wafer, the photoresist is patterned and unwanted portions of the aluminum layer are etched away, leaving behind a plurality of bond pads. Following definition of the bond pads, a passivation layer 14 is blanket deposited over the entire wafer. Then, a photoresist is deposited so as to overlie the passivation layer, the photoresist is patterned, and unwanted portions of the passivation layer are removed. The passivation layer is on the order of 0.5 to 2.0 microns, nominally 1.1 microns. The passivation layer generally has a glassy structure, such as glassy silicon dioxide. The passivation layer may also be formed of silicon oxynitride and silicon nitride, for example. Like the prior art, a portion of the passivation layer 14 overlying bond pad 12 is removed, so as to expose bond pad 12. However, according to a particular development of the present invention, a stress isolation trench 15 is formed in the passivation layer, overlying the bond pad 12. Removal of portions of the passivation layer 14 to define the stress isolation trench 15 and the opening to the bond pad 12 may be executed at the same time, by appropriately patterning a photoresist layer overlying the passivation layer 14. The stress isolation trench has a width generally on the order of 0.5 to 5 microns. Preferably, the trench 15 extends completely through the thickness of the passivation layer 14, and overlies the bond pad 12, so as not extend over the edge of the bond pad 12 onto silicon die 10. The trench is generally spaced from the edge of the bond pad 12 by a minimum distance of 3 microns, such as 6 microns, and preferably 10 microns.

Figure 2:
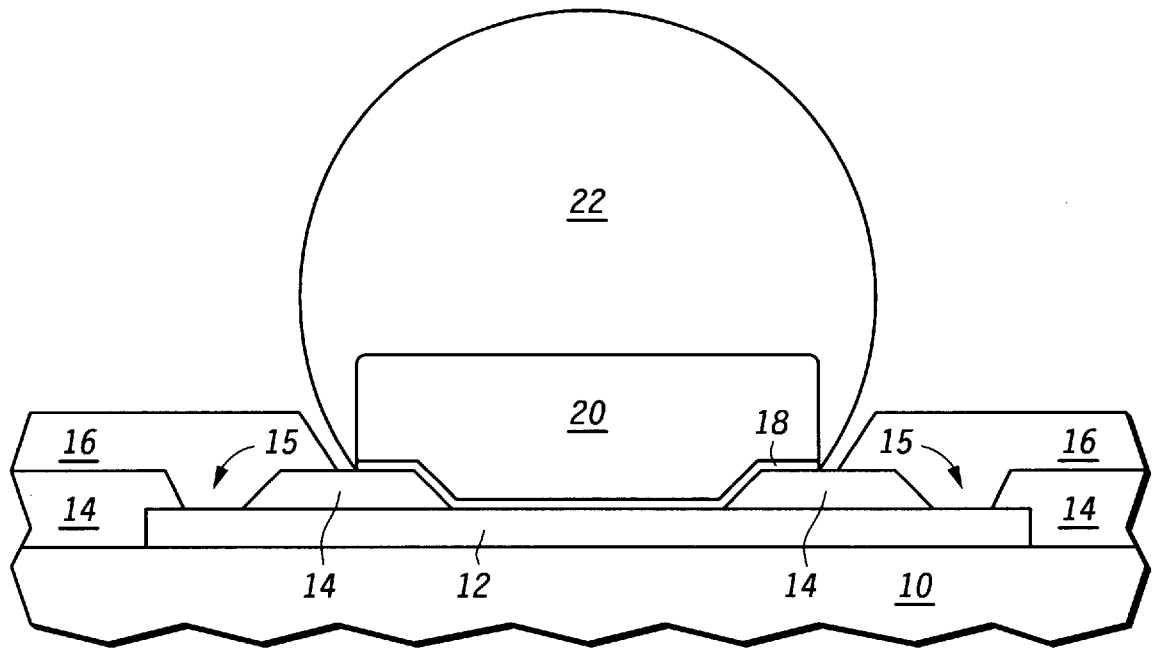
FIG. 2 is a cross-section of an embodiment of the present invention, incorporating a stress isolation trench.

According to the embodiment shown in FIG. 2, an additional layer, particularly, a polyimide layer 16, is blanket deposited and etched back. The polyimide layer advantageously fills in the stress isolation trench 15. Following formation of the polyimide layer 16, under bump metallization (UBM) layer 18 is blanket deposited and etched back. The UBM layer 18 generally includes titanium, tungsten and copper. Although the under bump metallization is shown as a single layer, it may be formed of multiple layers. Thereafter, the under bump metallization layer 18 is exposed to a bath containing copper, and a copper stud is grown on under bump metallization 18. The copper stud 20 generally has a thickness on the order of 12 to 45 microns. Following plating to form the stud 20, a solder bump 22 is electroplated so as to overlie the copper stud 20. Here, the bump is generally comprised of lead and tin, preferably, eutectic solder (63% Sn, 37% Pb). Following deposition of solder bump 22, the structure is reflowed at a temperature on the order of 185 to 220 degrees C., such that solder bump 22 assumes the generally spherical shape shown in FIG. 2.

Following reflow of the solder bump, the semiconductor die 10 is now ready to be bonded to an epoxy printed circuit board according to the DCA process, or to an intermediate substrate, which may be ceramic or plastic. Here, the semiconductor die 10 is flipped over, and the solder bumps 22 are aligned with conjugate bonding pads on the substrate or circuit board and reflow is carried out to effect mechanical and electrical connection. As is known in the art, bonding to the circuit board or to a substrate is completed by incorporating an underfill material between the semiconductor die 10 and the respective circuit board or substrate.

Figure 3:
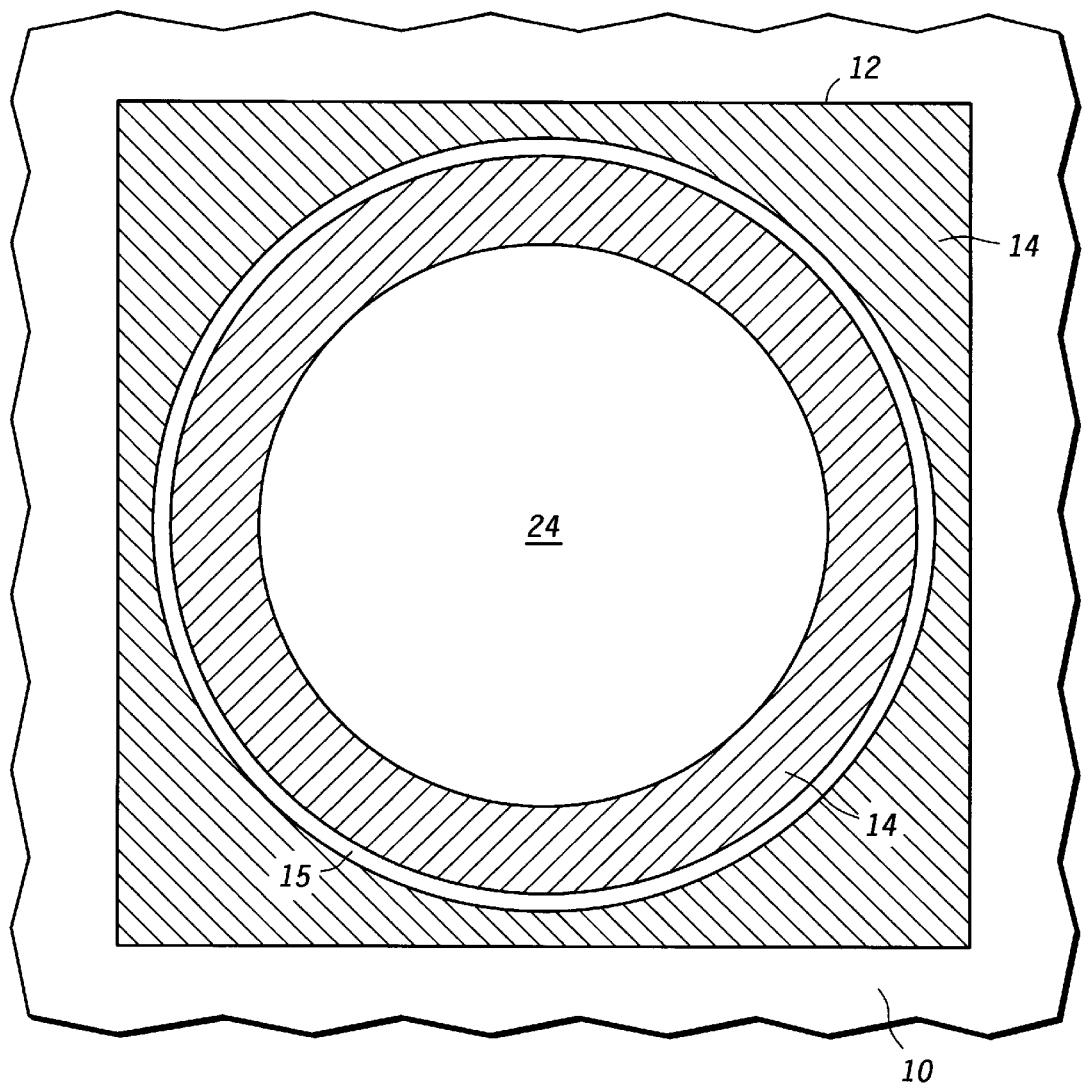
FIG. 3 is a plan view of a solder bump structure according to an embodiment of the present invention, prior to formation of the solder bump.

FIG. 3 illustrates a plan view of the solder bump structure according to the present invention. As can be seen, stress isolation trench 15 is continuous, has a generally circular shape, and completely surrounds passivation opening 24, in which solder bump 22 is formed. Solder bump 22 is omitted from this view for clarity. Preferably, the stress isolation trench 15 is continuous and completely surrounds the solder bump, to effectively prevent crack propagation through the passivation layer 14.

Although a solder bump structure has been described above with respect to formation of a solder bump by electroplating, it should be well understood that the solder bump may be formed by other techniques, including electroless plating, C4 and E3 processing. In each of these cases, the process flow for forming the solder bump structure uses conventional techniques, with the exception of patterning the photoresist for defining the stress isolation trench 15. That is, the photoresist is patterned so as to define not only the opening to the bond pad 12 in the passivation layer 14, but also the stress isolation trench 15. In this regard, it is noted that in techniques that selectively deposit, rather than blanket deposit, the under bump metallization layer, the polyimide layer 16 may be omitted. That is, in processes in which the bond pad is not exposed through the isolation trench during deposition of components of the solder bump, the polyimide layer need not be present to isolate the exposed portion of the bond pad in the trench.

While the present invention has been described above with particularity, it is well understood that one of ordinary skill in the art may make modifications and variations to the present invention without departing from the scope of the claims attached hereto.

We claim:

1. A method of forming a bumped semiconductor device, the method comprising the steps of:
   providing a substrate having a bond pad;
   forming a passivation layer wherein a portion of the passivation layer overlies the bond pad;
   patterning the passivation layer to form a trench; and
   forming a bump overlying the bond pad, wherein the bump is surrounded by the trench.

2. The method of claim 1, wherein the trench is continuous and forms a closed-loop surrounding the bump.

3. The method of claim 1, wherein an entirety of the trench extends through an entire thickness of the passivation layer.

4. The method of claim 1, wherein an entirety of the trench overlies the bond pad.

5. The method of claim 1, wherein the passivation layer includes a material selected from a group consisting of silicon dioxide, silicon oxynitride, and silicon nitride.

6. The method of claim 1, further comprising a step of forming an additional layer, wherein the additional layer overlies the passivation layer.

7. The method of claim 6, wherein the additional layer comprises a polyimide.

8. The method of claim 6, wherein the additional layer fills the trench.

9. The method of claim 1, wherein the trench has a width of at least approximately 0.5 microns.

10. The method of claim 1, wherein the step of forming the bump is performed using an evaporation process.

11. The method of claim 1, wherein the step of forming the bump is performed using a plating process.

12. The method of claim 1, wherein:
   patterning the passivation layer also forms an opening;
   the opening and the trench are separated by a portion of the passivation layer; and
   the portion of the passivation layer is bounded by a perimeter of the opening and an inner perimeter of the trench.

13. The method of claim 12, wherein at least a portion of the bump lies within the opening.

* * * * *